United States Patent [19]

Taylor, Jr.

[11] Patent Number: 4,923,780
[45] Date of Patent: May 8, 1990

[54] PROCESS FOR MAKING A REVERSE IMAGE USING A PIGMENTED PEEL-APART PHOTOSENSITIVE ELEMENT CONTAINING A PHOTOINHIBITOR

[75] Inventor: Harvey W. Taylor, Jr., Sayre, Pa.

[73] Assignee: E. I. Du Pont de Nemours and Company, Wilmington, Del.

[21] Appl. No.: 282,642

[22] Filed: Dec. 12, 1988

[51] Int. Cl.⁵ .................. G03C 11/12; G03C 5/16
[52] U.S. Cl. .................... 430/257; 430/258; 430/293; 430/292; 430/917; 522/2; 522/913; 522/914
[58] Field of Search ............. 430/258, 917, 257, 293, 430/292; 522/2, 913, 914

[56] References Cited

U.S. PATENT DOCUMENTS

4,269,933  5/1981  Pazos .................. 430/917 X
4,477,556 10/1984  Dueber et al. .......... 430/281

Primary Examiner—Paul R. Michl
Assistant Examiner—Cynthia Hamilton

[57] ABSTRACT

This invention relates to a process for preparing a reverse image using a pigmented peel-apart element containing a photoinhibitor. More particularly this invention relates to a process for preparing a negative or reverse surprint proof using peel-apart photosensitive elements comprising a strippable cover sheet; a photoadherent layer containing a colorant and a photoinhibitor compound; a tacky, essentially nonphotosensitive contiguous layer; and a support.

12 Claims, 1 Drawing Sheet

PROCESS FOR MAKING A REVERSE IMAGE USING A PIGMENTED PEEL-APART PHOTOSENSITIVE ELEMENT CONTAINING A PHOTOINHIBITOR

FIELD OF THE INVENTION

This invention relates to a process for preparing a reverse image using a pigmented peel-apart element containing a photoinhibitor. More particularly this invention relates to a process for preparing a negative or reverse surprint proof using peel-apart photosensitive elements comprising a strippable cover sheet; a photoadherent layer containing a colorant and a photoinhibitor compound; a tacky, essentially nonphotosensitive contiguous layer; and a support.

BACKGROUND OF THE INVENTION

Color proofs are used by the graphic arts industry, usually prior to printing, to determine how a printed color image will appear. Proofs provide an inexpensive way to check the quality of color separations prior to an actual printing run.

Many photosensitive elements are known which are useful for the preparation of color proofs. After imagewise exposure the photosensitive elements may be developed by organic solvent or aqueous washout of soluble image areas, toning tacky image areas with a colorant, peeling apart photoadherent layers, or combinations of these techniques. A useful reference for color proofing methods is *Principles of Color Proofing*, by Michael H. Bruno, GAMA Communications, Salem, NH, 1986.

Clear, uncolored, photopolymerizable or photohardenable layers may be developed after imagewise exposure by applying colorants which adhere selectively to the unexposed areas. Chu et al., U.S. Pat. No. 3,649,268, describes a process in which an element having a removable support and a photohardenable layer is (1) laminated to a receptor layer, and (2) imagewise exposed using a color separation transparency of the original image to be reproduced through the support to actinic radiation to selectively raise the tack temperature of the areas receiving the radiation, then (3) the support is stripped from the layer, and the outer surface of the layer treated (e.g, dusted) with a particulate material, usually a colored pigment, or toner, which adheres only to the tacky unexposed areas of the layer thereby producing a positive image. By laminating additional elements to the toned surface, exposing each element with a different color separation record, stripping, and toning with a corresponding color, a multicolor image can be obtained. However, the process has the limitation of producing only a positive-working or duplicate image (i.e., the pigment image is a duplicate of the positive transparency used for exposure) and is, therefore, restricted in use, particularly where it is desired to produce a negative or reverse image (i.e., an image which is complementary to the image on the transparency used for exposure). This process also requires that the image be developed by application of a colorant.

Dueber et al., U.S. Pat. No. 4,477,556, the teaching of which is incorporated by reference, describes compositions and processes which are capable of producing either a positive or negative polymeric image on a substrate. The photopolymerizable layer contains a photosensitive acidic o-nitroaromatic compound which generates a polymerization-inhibiting nitrosoaromatic compound. However, the development process of Dueber et al. has the disadvantage of being a washout procedure, i.e., one which uses liquids, rather than a dry process.

In Cohen and Fan, U.S. Pat. No. 4,282,308 there is described a photopolymerizable element which is capable of producing reverse colored images by a dry process without the need for toning with a colorant. The element comprises, in order from top to bottom, a transparent strippable cover sheet, a photoadherent layer containing a colorant, a tacky nonphotosensitive organic contiguous layer, and a support. After imagewise exposure to actinic radiation through the cover sheet, the element can be peeled apart by peeling off the cover sheet with the exposed areas of the photoadherent layer adherent thereto, thus forming a negative image on the cover sheet. The peel force required to remove the cover sheet and the exposed photoadherent layer from the contiguous layer is at least four times the peel force required to remove the cover sheet from an unexposed photoadherent layer. When the exposure is through a negative image, e.g., a negative separation transparency, and the element is peeled apart, a positive image is obtained on the peeled off cover sheet and a negative image on the contiguous layer. When the exposure is through a positive image, e.g., a positive separation transparency, and the element is peeled apart, a negative image is found on the cover sheet and a positive image is obtained on the supported tacky contiguous layer. To produce a negative multicolor proof, a series of appropriately colored negative images would have to be laminated in register on top of each other.

In Taylor, U.S. Pat. No. 4,489,154, the disclosure of which is incorporated herein by reference, there is described a process for preparing a surprint proof by a dry process without the need for toning with a colorant. This process uses an imagewise exposed, peel-apart photosensitive element comprising a strippable cover sheet; a photoadherent layer containing a colorant; a tacky, essentially nonphotosensitive contiguous layer; and a support. After exposure to actinic radiation through a positive image, e.g., a positive separation transparency, and peeling apart, a positive colored photoadherent image is produced on the supported contiguous layer. This image is then adhered to a substrate. By repeating this process with different colored layers, a multicolor surprint proof can be built up on the substrate. If exposure is through a negative image, e.g., a negative separation transparency, a positive colored photoadherent image is obtained on the cover sheet. While this image can be transferred to a substrate and the process repeated as above to build up a negative or reverse surprint proof, i.e., a positive proof produced from a set of negative separation transparencies, it is generally not practical to do so because of the problems of registration and image distortion which result from laminating after the exposure step.

It is desirable to provide an improved method of producing a negative or reverse surprint proof. Such a method should be a dry process which also does not require application of a colorant, and does not require lamination after exposure. It is also desirable to provide an improved proofing method utilizing elements which can produce either a positive or a negative surprint proof.

SUMMARY OF THE INVENTION

This invention provides an improved process for producing a negative or reverse image on a multilayer peel-apart photosensitive element, comprising, in the stated order, the steps of:

(1) providing a multilayer, peel-apart photosensitive element, comprising, in order from top to bottom,
  (a) a strippable cover sheet comprised of a polymeric film which is transparent to actinic radiation,
  (b) a photoadherent layer comprising a photohardenable material with ethylenically unsaturated groups, an o-nitroaromatic photoinhibitor compound, a free-radical generating photoinitiator or photoinitiator system activatable by actinic radiation of wavelength(s) greater than 380 nm, and a colorant; and
  (c) an essentially nonphotosensitive organic contiguous layer,
  wherein, after exposure to actinic radiation substantially limited to wavelengths greater than about 380 nm, the peel force required to remove the cover sheet (a) with the exposed photoadherent layer (b) thereon from the contiguous layer (c) is at least four times the peel force required to remove the cover sheet (a) from the unexposed photoadherent layer (b),
(2) exposing the multilayer peel-apart element through an image-bearing transparency to actinic radiation which has a wavelength of about 200 to about 380 nm, whereby a polymerization inhibitor is formed in the areas struck by the radiation;
(3) exposing the element overall to actinic radiation substantially limited to wavelengths greater than 380 nm, whereby the unexposed areas of step (2) are polymerized;
(4) peeling the cover sheet (a) from the photoadherent layer (b), whereby the areas exposed in step (2) remain on the contiguous layer (c) as a negative or reverse image of the transparency used.

The multilayer, peel-apart photosensitive element may further comprise a releasable support (d) adhered to the contiguous layer (c). Before step (2) above, the releasable support may be removed, and the element adhered to a receptor support.

More preferred is a process wherein the releasable support is removed and the element is adhered to a receptor support, and wherein steps (1) to (4) above are repeated at least once, each time using a peel-apart photosensitive element comprising a different colorant which is adhered to the preceding element by its contiguous layer (c), and exposed in register through a corresponding color separation transparency, thereby forming a multicolor reverse image surprint. To prepare a standard four-color proof, yellow, magenta, cyan, and black colored layers may be superimposed.

In a preferred embodiment of this invention the photoadherent layer contains an o-nitroaromatic photoinhibitor, a colorant, a macromolecular organic binder, an addition polymerizable ethylenically unsaturated monomer, and a free-radical generating addition polymerization initiator or initiating system activatable by actinic radiation of wavelength(s) greater than 380 nm.

In a more preferred embodiment of this invention the photoinhibitor compound is an o-nitroaromatic of the type disclosed in Pazos, U.S. Pat. No. 4,198,242, the teaching of which is incorporated herein by reference. The preferred photoinhibitors are 6-nitroveratraldehyde and 1-[1-[4-(1,1-dimethylethyl)-phenoxy]ethyl]- 4,5-dimethoxy-2-nitrobenzene. In a more preferred embodiment of this invention the free radical generating initiator system consists of a 2,4,5-triarylimidazole dimer, a hydrogen donor and a visible light sensitizer. Preferred visible sensitizers include the bis(p-dialkylaminobenzylidine) ketones disclosed in Baum and Henry, U.S. Pat. No. 3,652,275, and the arylidene aryl ketones disclosed in Dueber, U.S. Pat. No. 4,162,162, as well as in U.S. Pat. Nos. 4,268,667 and 4,351,893, the teaching of each of which is incorporated herein by reference. Particularly preferred visible light sensitizers are dimethoxy-JDI and DBI, as defined infra.

BRIEF DESCRIPTION OF THE DRAWINGS

In the accompanying Figures forming part of this disclosure.

DETAILED DESCRIPTION OF THE INVENTION

The invention is a dry process for producing a negative or reverse image, more preferably a multicolor surprint proof. The process utilizes a versatile precolored photosensitive peel-apart element capable of producing either positive or negative images. The peel-apart element comprises a strippable cover sheet: a photoadherent layer containing a colorant and a photoinhibitor; a tacky, essentially nonphotosensitive contiguous layer; and a support. By a "dry process" is meant a process in which liquids need not be used. Peel-apart elements capable of producing a high quality image require a complex balance of cohesive and adhesive forces within and between the various layers. Such elements are technically difficulty to achieve, and it has not been previously demonstrated that a photoinhibitor/photoinitiator system could be incorporated in such elements and that they could be used with two different exposures to produce a reverse image.

The photoadherent layer, which is the sole photosensitive layer of the element, is one whose adhesive relationship between the cover sheet and the contiguous layer is altered by exposure to actinic radiation, so that after exposure the exposed areas of the photoadherent adhere more strongly to the cover sheet than to the contiguous layer and are peeled off with the cover sheet while the unexposed areas of the photoadherent layer adhere more strongly to the tacky contiguous layer than the cover sheet, and thus remain on the contiguous layer.

Adhesive and cohesive force relationships of the layers are useful in characterizing the elements of this invention wherein $A_1$ represents the adhesive force between the cover sheet (1) and the unexposed photoadherent layer (2); $A_2$ represents the adhesive force between the unexposed photoadherent layer (2) and the tacky contiguous layer (3); and C represents the cohesive value of the unexposed photoadherent layer (2). Thus in the unexposed state $A_1$ is the lowest value, and the element will peel at the cover sheet/photoadherent layer interface. The force relationship may be represented by:

$$C > A_1 < < A_2$$

It has been found that upon imagewise exposure of the element, dramatic changes occur in adhesive and cohesive values. $A_1^*$ represents the adhesive force between exposed areas (5) of the photoadherent layer (2) and the cover sheet (1); $A_2^*$ represents the adhesive force between exposed areas (5) and the tacky contiguous layer (3); and $C^*$ represents the cohesive value of the photoadherent layer in the exposed areas (5). Thus in the exposed state $A_2^*$ is the lowest value while the cohesive value C of the unexposed areas also must be sufficiently low to allow a clean break in the photoadherent layer (2) at the interface between the exposed areas (5) and the unexposed areas (6) to allow exposed areas (5) to be completely removed when the cover sheet is peeled away. The resulting force relationship may be represented by:

$$C < A_1^* > > A_2^* < C^*$$

The combined effect of these cohesive and adhesive values is measured by the force required to peel or remove the cover sheet at an angle of 180 degrees from the surface of an element as a function of the amount of actinic exposure and the cover sheet removal rate. Although peel force increases with increasing cover sheet removal rate, this increase is relatively small in the range above 600 inches/minute (1524 cm/minute). Typically for elements of this invention peel force in the exposed areas, $A_2^*$, is dramatically higher than in the unexposed areas, $A_1$, i.e., at least four times higher and preferably at least an order of magnitude different. Surprisingly, these elements also show greatly improved image fidelity and tonal range. Thus in the unexposed state, the peel force to remove the cover sheet is very low and separation occurs at the interface between the cover sheet and the photoadherent layer and is equivalent to adhesive force $A_1$. For this invention adhesive forces $A_1$ typically are below 20 g/inch (7.9 g/cm) and are generally between 5 and 10 g/inch (1.97 and 3.94 g/cm). Upon exposure, following the induction period, photopolymerization or photoadhesion starts and peel force values increase rapidly with continued exposure. At intermediate exposures where polymerization of the photoadherent layer is insufficient the separation occurs at intermediate points in the photoadherent layer and does not give a good image. At the correct exposure level, however, the locus of failure shifts to the interface between the exposed photoadherent layer and the contiguous layer. The peel force at this point reaches a plateau and remains substantially constant over an extensive exposure range. Peel forces in the plateau regions are equivalent to adhesive forces $A_2^*$. For this invention adhesive forces $A_2^*$ are typically above 80 g/inch (31.5 g/cm), and preferably are between 100 and 700 g/inch (39.4 and 275.6 g/cm). Thus the ratio of adhesive forces for exposure to unexposed elements, i.e., ($A_2^*/A_1$) is at least 4, and preferably between 10 and 100 or above.

As discussed above, peel-apart photosensitive elements which can be used to produce a high quality image are technically difficult to achieve in that they require a complex balance of forces within the element. It has not been previously demonstrated that an image reversal process employing one or more photoinhibitors and a photoinitiator or photoinitiator system, and two exposure steps using radiation of different wavelengths, as taught herein, could be achieved in a multilayer, peel-apart system.

The cover sheet of the element of the invention must be strippable (i.e., removable by peeling off) from the rest of the element, carrying with it only the exposed and photohardened areas of the photoadherent layer. The cover sheet is preferably oxygen impermeable and transparent to actinic radiation so that the element may be exposed through the cover sheet. Preferred materials for the cover sheet are polymeric films, particularly polyester films such as polyethylene terephthalate. Polyamide, polyimide, polystyrene, or polyolefin, e.g., polyethylene or polypropylene films may also be employed. In order to make the exposed areas of the photoadherent layer adhere better to the cover sheet, the cover sheet's surface may be modified; for example, the topography may be altered and/or the polarity increased by a surface treatment such as electrostatic discharge or flame treatment. In the case of a polyethylene terephthalate film having a thickness of 0.0005 inch (0.013 mm), an electrostatic discharge of at least 0.025 coulomb/ft² (0.272 coulomb/m²) is suitable. However, increased treatments may be used. Flame treatment of the film also will provide good photoadhesion. An air-propane flame may be used.

While the thickness of the cover sheet may be varied over a wide range, films having a thickness of 0.001 inch (0.025 mm) or less are particularly preferred. Thin cover sheets produce halftone dots of good roundness with sharp edges. In addition, a tonal range of 2-98% dot resolution (using a halftone screen with 150 lines/inch) and a rapid rate of cover sheet strippability, e.g., up to 9,000 inches/minute (22,860 cm/minute) or higher, is obtainable with thin cover films. By "tonal range" is meant the range of sizes of resolvable halftone dots as a percentage of a maximum dot size. In general, a rapid rate of cover sheet stripping produces better image quality. The cover sheet should be thick enough so that electrostatic discharge or flame treatment will not injure it and so that it may be stripped without tearing. The cover sheet may additionally comprise auxiliary treatments or layers to improve adhesion, strength, and other properties.

After imagewise exposure of the peel-apart photosensitive element to actinic radiation through a halftone or line transparency, the exposed areas of the photoadherent layer adhere more strongly to the cover sheet than to the contiguous layer in the exposed areas and more strongly to the contiguous layer than to the cover sheet in the unexposed areas. Photohardenable materials are used for the photoadherent layer. Such materials are usually comprised of a material with ethylenically unsaturated groups in which an increase in molecular weight and, consequently, an increase in adherence to the cover sheet are caused by exposure to actinic radiation. The well known ethylenically unsaturated materials which are photopolymerizable are preferred. Such materials are described, for example, in Chu et al., U.S. Pat. No. 3,649,268, the teaching of which is incorporated herein by reference.

Particularly preferred are photopolymerizable compositions comprised of a macromolecular organic polymeric binder and an addition polymerizable ethylenically unsaturated monomer. The binder can be a polar material, such as an acidic polymer containing at least 1.5 mole percent free acid groups to impart polarity to the polymer, or a nonpolar material, e.g., materials as described in Burg et al., U.S. Pat. No. 3,060,023; Chu et al., U.S. Pat. No. 3,649,268; and Collier et al., U.S. Pat. No. 3,984,244. The monomer has at least one and preferably two or more terminal ethylenically unsaturated groups capable of free-radical initiated, chain propagated addition polymerization, said monomer preferably having some degree of polarity and being compatible with the binder and with the polar surface of the cover sheet, but substantially nondiffusible in the contiguous tonable layer.

Among acidic binders which have been found useful, there may be mentioned co(methyl methacrylate/methacrylic acid) and monoethyl ester of poly(methyl vinyl ether/maleic anhydride), each of which may be copolymerized in various proportions. Many other polar polymers and copolymers are known which will be found useful as a binder in the photopolymerizable layer. Among the ethylenically unsaturated monomers which have been found useful are those disclosed in Plambeck, U.S. Pat. No. 2,760,863; Cohen and Schoenthaler, U.S. Pat. No. 3,380,831; and Chambers and Woodward, U.S. Pat. No. 3,573,918. There may be mentioned, as examples, dipentaerythritol acrylate (50% tetra and 50% penta), pentaerythritol triacrylate and tetraacrylate, polypropylene glycol (50) ether of pentaerythritol tetraacrylate, polyethylene glycol (200) dimethacrylate, dipentaerythritol monohydroxy pentaacrylate, pentaerythritol triacrylate beta-hydroxyethyl ether, polypropylene glycol (550) ether of pentaerythritol tetramethacrylate, pentaerythritol tetramethacrylate, polypropylene glycol (425) dimethacrylate, trimethylolpropane trimethacrylate, and polypropylene glycol (340) ether of trimethylol propane triacrylate. Also useful are epoxy monomers containing ethylenic unsaturation, e.g., monomers of the type disclosed in U.S. Pat. No. 3,661,576 and British Pat No. 1,006,587.

As defined herein, a photoinhibitor is a compound which is not itself an inhibitor of the free-radical polymerization of ethylenically unsaturated monomers, but which, on exposure to actinic radiation which it absorbs, is converted to a free-radical polymerization inhibitor.

Certain nitroaromatic compounds in which the nitro group is ortho to a hydrogen-bearing alpha-carbon substituent do not themselves significantly retard or inhibit free-radical polymerization in certain photopolymerizable systems, but are photochemically converted to nitrosoaromatic inhibitors of free-radical polymerization by exposure to radiation having a wavelength of about 200 to 380 nm. These compounds are disclosed in Pazos, U.S. Pat. No. 4,198,242 and Dueber et al., U.S. Pat. No. 4,477,556, the disclosures of which are incorporated herein by reference.

These o-nitroaromatic compounds are relatively unaffected by radiation of longer wavelength. However, certain radiation-sensitive free-radical initiators absorb radiation of longer wavelengths, especially in the presence of appropriate sensitizers, to provide sufficient radicals to cause polymerization of a polymerizable monomer in the absence of an appreciable concentration of inhibiting nitrosoaromatic species.

The nitroso compounds formed by irradiation of the nitroaromatic compounds with short wavelength radiation interfere with the normal free-radical-induced polymerization process. Thus, when irradiation occurs with only the shorter wavelength region of the spectrum (200 to 380 nm) in the presence of one or more defined nitroaromatic compound(s), polymerization will not occur. This is because the nitroaromatic compounds absorbs most of the actinic radiation so that few initiating radicals are formed. Those few initiating radicals which are formed by the photoinitiator system react with the nitrosoaromatic inhibitor. Therefore, an insufficient number of initiating and propagating free radicals are available to effect polymerization. When a composition of this invention is exposed to radiation of wavelength greater than about 380 nm, the nitroaromatic compound is relatively unaffected, and the photoinitiator system operates to produce initiating radicals. These radicals are able to effect chain propagation in the usual way and polymerization occurs.

Most of the actinic radiation in the 200 nm to 380 nm range must be absorbed by the photoinhibitor compound since more polymerization inhibitor than polymerization initiating free radicals must be generated during the imagewise exposure with actinic radiation in the 200 nm to 380 nm range. This may be accomplished either by using a photoinitiator system which does not absorb and is not activated by actinic radiation in the 200 nm to 380 nm range, and/or by arranging the relative concentrations of the photoinhibitor compound and photoinitiator system so that most of the actinic radiation is absorbed by the photoinhibitor compound. As is well known to those skilled in the art, the relative concentrations of photoinhibitor compound and photoinitiator system necessary to insure that most of the actinic radiation is absorbed by the photoinhibitor compound can be calculated from the respective molar extinction coefficients of the photoinhibitor compound and photoinitiator system, whose values may be determined by conventional spectophotometry.

Useful o-nitroaromatic photoinhibitor compounds include:

wherein
R¹ and R², alike or different, are alkoxy of 1 to 6 carbon atoms;
R³ is hydrogen or alkyl of 1 to 6 carbon atoms;
R⁴ is alkoxy of 1 to 6 carbon atoms or phenoxy substituted with up to two alkyl and/or alkoxy groups of 1 to 6 carbon atoms; or
R³ and R⁴ taken together are =O.

Preferred photoinhibitors are 6-nitroveratraldehyde and 1-[1-[4-(1,1-dimethylethyl)-phenoxy]ethyl]-4,5-dimethoxy-2-nitrobenzene, which have the following structures, respectively.

Other suitable nitroaromatic compounds are listed in Pazos, U.S. Pat. No. 4,198,242, Column 7, line 31, to Column 9, line 8, the disclosure of which is incorporated herein by reference.

The free-radical generating system absorbs and is activated by actinic radiation with wavelengths within the range of about 380 nm to 800 nm, wavelengths which do not significantly rearrange the nitroaromatic compound to an inhibitor of free-radical polymerization. By "actinic radiation" is meant radiation which is active to produce the free-radicals necessary to initiate polymerization of the monomeric material. The free-radical generating system can comprise one or more compounds which directly furnish free-radicals when activated by the radiation. It can also comprise a plurality of compounds, one of which yields the free radicals after having been caused to do so by a sensitizer which is activated by the radiation. Preferably the free-radical generating system has at least one component having a radiation absorption band with a molar extinction coefficient of at least 50 within the range of greater than 380 to about 800 nm, and more preferably about 400 to about 600 nm.

Preferred initiator systems are 2,4,5-triphenylimidazolyl dimers with hydrogen donors, and mixtures thereof as described in U.S. Pat. Nos.: 3,427,161; 3,479,185; 3,549,367; 4,311,783; 4,622,286; and 3,784,557, sensitized by visible sensitizers. Useful 2,4,5-triarylimidazolyl dimers are disclosed in Baum et al., U.S. Pat. No. 3,652,275, column 5, line 44 to column 7, line 16, the disclosure of which is incorporated herein by reference. Particularly preferred photoinitiators include CDM-HABI, i.e., 2-(o-chlorophenyl)-4,5-bis(m-methoxyphenyl)-imidazole dimer; o-Cl-HABI, i.e., 1,1'-biimidazole, 2,2'-bis (o-chlorophenyl)-4,4',5,5'-tetraphenyl-; and TCTM-HABI, i.e., 1H-imidazole, 2,5-bis(o-chlorophenyl)-4-[3,4-dimethoxyphenyl]-, dimer, each of which is typically used with a hydrogen donor.

Preferred sensitizers are of the following structure:

wherein

R¹, R², and R³ are, independently, H or alkoxy of 1 to 6 carbon atoms;
Z is CH₂ or C(CH₃)₂;
R⁴ is H, CH₃, or methoxy;
R⁵ and R⁶ are H;
R⁷, R⁸ are, independently, CH₃ or CH₂CH₃; or
R⁵+R⁸ and R⁶+R⁷ are, independently, —(CH₂)₂— or —(CH₂)₃—.

Particularly preferred sensitizers are dimethoxy-JDI, i.e., 1H-Inden-1-one, 2,3-dihydro-5,6-dimethoxy-2-[(2,3,6,7-tetrahydro-1H, 5H-benzo[i,j]quinolizin-9-yl)methylene]-; and DBI, i.e., 1H-Inden-1-one, 2,3-dihydro-2[(4-(diethylamino)-2-methylphenyl)methylene]-, which have the following structures, respectively:

Sensitizers useful with these photoinitiators include methylene blue and those disclosed in U.S. Pat. Nos. 3,554,753; 3,563,750; 3,563,751; 3,647,467; 3,652,275; 4,162,162; 4,268,667; 4,351,893; 4,454,218; 4,535,052; and 4,565,769.

A preferred group of sensitizers includes the bis(p-dialkylaminobenzylidine) ketones disclosed in Baum et al., U.S. Pat. No. 3,652,275, and the arylyidene aryl ketones disclosed in Dueber, U.S. Pat. No. 4,162,162, as well as in U.S. Pat. Nos. 4,268,667 and 4,351,893, the teaching of each of which is incorporated herein by reference.

Other useful sensitizers are listed in Dueber, U.S. Pat. No. 4,162,162, column 6, line 1 to line 65, the disclosure of which is incorporated herein by reference.

Hydrogen donor compounds useful as chain transfer agents in photopolymer compositions include 2-mercaptobenzoxazole, 2-mercaptobenzothiazole, etc.; as well as various types of compounds, e.g., (a) well as various types of compounds, e.g., (a) ethers, (b) esters, (c) alcohols, (d) compounds containing allylic or benzylic hydrogen, e.g., cumene, (e) acetals, (f) aldehydes, and (g) amides as disclosed in column 12, lines 18 to 58, of MacLachlan, U.S. Pat. No. 3,390,996, incorporated herein by reference. The preferred chain transfer agent is 2-MBO, 2-mercaptobenzoxazole.

The photoadherent layer is usually colored either yellow, magenta, cyan or black. Many colorants (pigments or dyes) can be used provided that they are compatible with the other ingredients present in the photoadherent layer. The formulations are usually balanced colorwise for a particular sequence of layers to give rise to a specific color balance in the proof. Factors such as pigment transparency will affect the order in which the different colored layers are applied. Examples of suitable colorants include:

yellow: Cromophtal ® Yellow 3G (C.I. No. Pigment Yellow 93), Hostaperm ® Yellow 3G (C.I. No. Pigment Yellow 154)

magenta: Monastral ® Violet R (C.I. No. Pigment Violet 19), 2,9-Dimethylquinacridone (C.I. No. Pigment Red 122), Indofast ® Brilliant Scarlet R6300 (C.I. No. Pigment Red 123);

cyan: Monastral ® Blue G (C.I. No. Pigment Blue 15), Monastral ® Blue (BT 383D) (C.I. No. Pigment Blue 15) Monastral ® Blue G (BT 284D) (C.I. No. Pigment Blue 15), Monastral ® Green GT (751D) (C.I. No. Pigment Green 7);

black: Raven ® 450 (C.I. No. Pigment Black 7), Raven ® 1035 (C.I. No. Pigment Black 7), Elftex ® 8 (C.I. No. Pigment Black 7), Elftex ® 12 (C.I. No. Pigment Black 7), etc.

The photoadherent layer may also contain other ingredients which are conventional components used in photopolymerizable systems so long as they do not interfere with the function of the peel-apart element. One of skill in the art can determine the suitability of such components, without undue experimentation. Such components include stabilizers, antihalation agents, optical brightening agents, release agents, surfactants, coating aids and plasticizers.

Normally a thermal polymerization inhibitor will be present to increase storage stability of the photopolymerizable composition. Useful thermal stabilizers include: hydroquinone, phenidone, p-methoxyphenol, alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene, dinitrobenzene, p-toluquinone and chloranil. The dinitroso dimers described in Pazos, U.S. Pat. No. 4,168,982, are also useful.

By the incorporation of optical brightening agents into the photoadherent layer, the image record is produced free from distortion due to halation effects and free from discoloration due to element components. Suitable optical brighteners useful in the process of the invention include those disclosed in U.S. Pat. Nos. 2,784,183; 3,664,394; and 3,854,950. Specific optical brighteners which are particularly useful in the photopolymerizable elements of this invention are 2-(stibyl-4")-(naphto-1',2',4,5)-1,2,3-triazol-2"-sulfonic acid phenyl ester and 7-(4'-chloro-6'-diethylamino-1',3',5'-triazine-4'-yl)amino-3-phenyl coumarin. Ultraviolet radiation absorbing materials useful in the invention are also disclosed in U.S. Pat. No. 3,854,950.

Compounds which have been found useful as release agents are described in Bauer, U.S. Pat. No. 4,326,010. A preferred release agent is polycaprolactone. A preferred surfactant is Fluorad ® FC430, liquid nonionic fluorosurfactant manufactured by the 3M Company. Polyethylene oxides are commonly used as coating aids. A preferred coating aid is Polyox ® WSRN 3000, which is polyethylene oxide MW400,000.

While the coating weight of the photoadherent composition may be varied, it has been found that a preferred range from 20–100 mg/dm$^2$ (providing a dry layer thickness of about 0.00006–0.00033 inch (0.0015–0.0084 mm) will give good image quality and tonable range.

The binder may be varied widely in its ratio with the monomer but in general it should be in the range of 3:1 to 1:3. The monomer should be compatible with, and may be a solvent for, and/or have a plasticizing action on the binder. The choice and proportions of monomer and binder are made in accordance with the requirements of selective photoadherence and hardness. In order to provide a suitable hardness, the monomer concentration is normally kept low so that the layer coated from the composition will be sufficiently hard and non-tacky.

The nitroaromatic compounds are ordinarily employed in concentrations of about 0.004 to about 0.7 part by weight per part of polymerizable compound. The preferred amount in any specific case will depend upon the particular monomer/free-radical generating system employed. In general, the preferred amount of nitroaromatic compound is about 0.04 to about 0.15 part by weight per part of polymerizable compound.

Most of the actinic radiation in the 200 nm to 380 nm range must be absorbed by the photoinhibitor compound since more polymerization inhibitor than polymerization initiating free radicals must be generated during the imagewise exposure with actinic radiation in the 200 nm to 380 nm range. This may be accomplished either by using a photoinitiator system which does not absorb and is not activated by actinic radiation in the 200 nm to 380 nm range, and/or by arranging the relative concentrations of the photoinhibitor compound and photoinitiator system so that most of the actinic radiation is absorbed by the photoinhibitor compound. As is well known to those skilled in the art, the relative concentrations of photoinhibitor compound and photoinitiator system necessary to insure that most of the actinic radiation is absorbed by the photoinhibitor compound can be calculated from the respective molar extinction coefficients of the photoinhibitor compound and photoinitiator system, whose values may be determined by conventional spectophotometry. Suitable compositions will ordinarily contain about 0.004 to about 0.7 part by weight of nitroaromatic inhibitor and about 0.001 to about 10 parts by weight of photoinitiator system, per part of polymerizable compound. It will be apparent to those skilled in the art that, when irradiation is carried out through a polyethylene terephthalate cover sheet, support, or photomask, the polyethylene terephthalate sheet will function as a filter and only actinic radiation greater than about 320 nm will strike the photohardenable layer.

Preferred compositions will normally contain: 35–45% binder, 35–45% monomer, 1–15% colorant, 1–5% 2,4,5-triphenylimidazolyl dimer, 1–2% chain transfer agent, 2–4% o-nitroaromatic photoinhibitor compound, 0.5–1.0% sensitizer and 0–15% other ingredients. The stated percentages are by weight.

The contiguous layer may be chosen from a great number of materials. The contiguous layer is an essentially nonphotosensitive tacky or slightly soft deformable organic material. The contiguous layer must be clear and essentially colorless to permit formation of a multilayer, full-color proof. For an element with good aging stability, suitable materials for the contiguous layer should restrain monomer diffusion from the photoadherent layer into the contiguous layer. Such materials may be selected from resins, polymers in which the monomer of the photoadherent layer is substantially nondiffusible, adhesive compositions, etc. Particularly preferred materials are elastomeric polymers and mixtures thereof having a second order transition temperature of −10° C. or lower which are inherently tacky or will accept tackifying agents and which are nonmigratory into said photoadherent layer and which will impart tackiness to the contiguous layer. Rubber type polymers, both natural and synthetic may be used, e.g., isobutylene, Thiokol A, nitrile rubbers, butyl rubber, chlorinated rubbers, polymers of butadiene, isoprene, poly(vinylisobutylether), and random, teleblock and block copolymers of butadiene or isoprene copolymerized with styrene, and neoprene, silicone elastomers, etc., in various proportions. With these materials, a stable adhesion balance between the photoadherent layer and a support for the contiguous layer, in a preferred element, may be achieved for elements useful in making color proofs by the surprint method.

Any suitable solvent may be used to coat the contiguous layer as long as it does not cause migration of components of the layer into the photoadherent layer when the two layers are coated simultaneously. The coating weight of the contiguous layer may be varied over a wide range, but generally a coating weight of about 40 mg/dm$^2$ (generally providing a dry thickness of about 0.00015 inch (0.0038 mm)) will be satisfactory. The contiguous layer may also be coated as a dispersion, e.g., an aqueous dispersions, with satisfactory results.

Figure 1A:
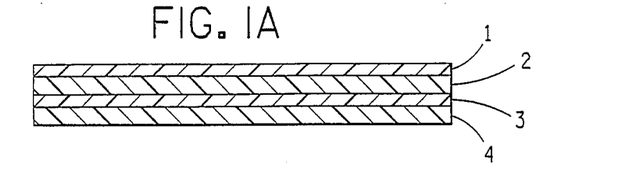
FIG. 1A illustrates a photosensitive element comprising a strippable cover sheet (1), a colored photoadherent layer (2), a contiguous layer (3), and a releasable support (4).

As illustrated in the drawings, the element has a releasable support (4) for the contiguous layer (3). The support (4) may be any suitable film which has the necessary dimensional stability and other characteristics for the proper adhesion to layer (3), e.g., photographic grade polyethylene terephthalate such as disclosed in Alles, U.S. Pat. No. 2,779,684.

The manufacture of the above-described elements may be accomplished in several different ways. For example, the photoadherent layer (2) may be coated on the cover sheet (1); after drying, the contiguous layer (3) is coated thereon from a solvent solution; finally, after drying, a support (4) may be laminated to the surface of layer (3). The solvent for the contiguous layer (3) should not have any solubilizing or deleterious effect on photoadherent layer (2). Another method is to coat the photoadherent layer (2) onto the cover sheet (1) and coat contiguous layer (3) onto a support (4) and then after drying the coated layers, laminating the surfaces of layers (2) and (3) together under pressure at room temperature or elevated temperature. Layers (2) and (3) may also be coated simultaneously in order onto the cover sheet (1) and then a support (4) may be laminated to the outer surface of layer (3). All of these methods are known to those skilled in the art of coating multilayer films.

Figure 1B:
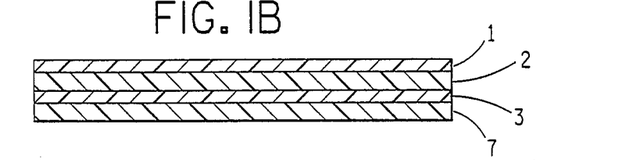
FIG. 1B illustrates the photosensitive element of FIG. 1A, minus the releasable support (4), adhered to a receptor support (7).

In using the photosensitive elements of this invention to prepare surprint proofs from conventional halftone negative color separation transparencies, the releasable support (4) is removed from a film element, after which the element, minus the releasable support, is adhered to a receptor support (7). The resulting composite structure is exposed through the cover sheet using a negative halftone or line separation transparency by means of actinic radiation to which the photoinhibitor compound is sensitive, e.g., 200 to 380 nm for o-nitroaromatic photoinhibitors, thus forming a free-radical polymerization inhibitor in the exposed areas. Then it is exposed overall to actinic radiation to which the photoinitiator system is sensitive, e.g., 380 to 700 nm for the arylyidene aryl ketone sensitized 2,4,5-triphenylimidazolyl dimer containing initiator system, thus initiating photopolymerization in the areas which were not struck by actinic radiation in the initial, imagewise exposure.

Figure 1C:
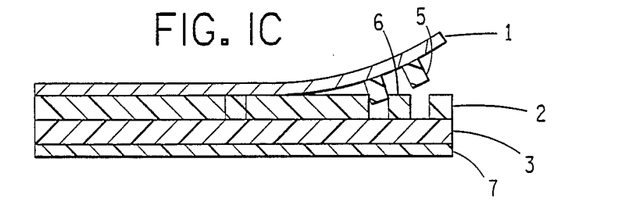
FIG. 1C illustrates the cover sheet (1) being removed after the second exposure, i.e., after exposure to actinic radiation of wavelengths greater than 380 nm in step (3) above. The colored areas (5) of the photoadherent layer (2) in which photoinhibitor has not been generated, i.e., the photohardened areas, adhere to and are removed with the strippable cover sheet (1) as it is peeled off after the nonimagewise exposure of the element to actinic radiation in step (3) above. Those colored areas (6) of the photoadherent layer (2) where photoinhibitor was generated remain on the supported contiguous layer (3).
Figure 1D:
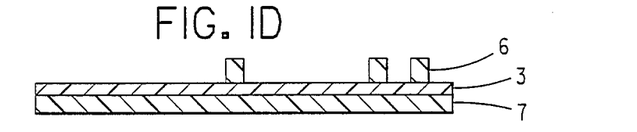
FIG. 1D illustrates first colored area (6), e.g., yellow, of a surprint proof formed on substrate (7) after removal of cover sheet (1).
Figure 1E:
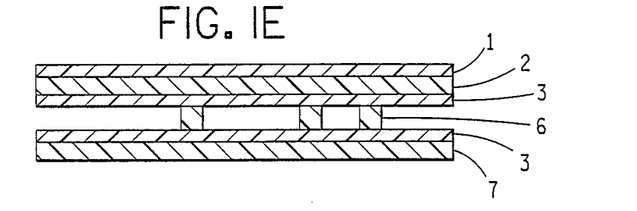
FIG. 1E illustrates a second photosensitive element, minus the releasable support (4), adhered to the element of FIG. 1D.
Figure 1F:
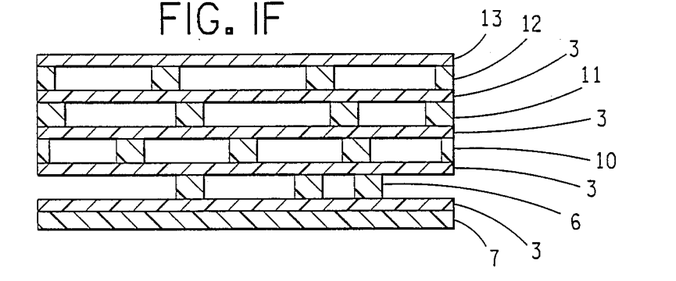
FIG. 1F illustrates a four color surprint proof formed on substrate (7) wherein three additional colored areas (10), (11) and (12), prepared from separate photosensitive elements as shown in FIG. 1A, are successively produced over the first colored areas (6), for example, yellow. The three additional colored areas (10), (11) and (12), for example, are magenta, cyan, and black, respectively. A protective layer (13) has been laminated over colored area (12).

The exposed element is then delaminated at room temperature by stripping the cover sheet (1) from the element with a moderate to rapid continuous motion. so that the colored imagewise exposed areas of the photoadherent layer remain on the receptor support. A second element, minus its releasable support, is adhered to the image thus prepared, exposed through a negative separation transparency, exposed overall, and delaminated as described above. This sequence of steps may be repeated several times using different colored elements and correspondingly colored separation transparencies.

In using the photosensitive elements of this invention to prepare surprint proofs from conventional halftone positive color separation transparencies, the releasable support is removed from a film element, and the element, minus the releasable support, is adhered to a receptor support. The resulting composite structure is exposed through the cover sheet using a positive separation transparency by means of actinic radiation to which the photoinitiator system is sensitive and to which the photoinhibitor is not sensitive, e.g., 380 to 700 nm for the arylyidene aryl ketones, thus initiating photopolymerization in the areas struck by actinic radiation.

The exposed element is then delaminated at room temperature by stripping the cover sheet (1) from the element, with a moderate to rapid continuous motion. so that the colored imagewise unexposed areas of the photoadherent layer remain on the receptor support. A second element, minus its releasable support, is adhered to the image thus prepared, exposed through a positive separation transparency, and delaminated as described above. This sequence of steps may be repeated several times to obtain a multicolor proof.

The substrate or receptor support, which is flat and preferably smooth, can be e.g, aluminum, e.g., anodized and/or silicated, copper (scrubbed) which may be present or a printed circuit board, films, e.g., polyethylene terephthalate of photographic grade which may be subbed as described in Alles, U.S. Pat. No. 2,779,684; adhesive subbed opaque polyethylene terephthalate film base, e.g., Melinex ® 994, sold by I.C.I. Americas, Wilmington, DE, and paper stock, e.g., Kromekote ® opaque white paper, Champion Paper Co., Stamford, Conn.

Any convenient source or sources of actinic radiation providing wavelengths in the region of the spectrum that overlap the absorption bands of the photoinhibitor compound and the photoinitiator system can be used to activate the reactions of inhibitor formation and photopolymerization. The radiation can be natural or artificial, monochromatic or polychromatic, incoherent or coherent, and for high efficiency should correspond closely in wavelengths to the absorption bands of the photoinihibitor compound and the initiator system.

Conventional light sources include fluorescent lamps, mercury, metal additive and arc lamps providing narrow or broad light bands centered near 405, 436 and 546 nm. Coherent light sources are pulsed xenon, argon ion, and ionized neon lasers whose emissions fall within or overlap the visible absorption bands of the sensitizer.

When broad spectrum light sources are used to form a surprint proof from negative separation transparencies, it is necessary to filter out the radiation in the spectral range above 380–400 nm during the initial, imagewise exposure. A filter capable of transmitting radiation in the spectral range of 315 to 380 nm and absorbing radiation in the spectral range 400 to 550 is described in Looney, U.S. Pat. No. 4,167,490. Such a filter is commercially available as Dylux ® flexible filter, manufactured by E. I. du Pont de Nemours and Company, Wilmington, DE.

INDUSTRIAL APPLICABILITY

The process of this invention is a dry method which utilizes a precolored peel-apart element having a photoadherent layer for preparing colored surprint proofs. After imagewise exposure through a color separation negative or positive with inhibitor-generating wavelengths, followed by nonimagewise exposure to polymerizing wavelengths, and peeling apart of the described photosensitive multilayer element, two complementary colored images are formed: one on the cover sheet and the other on the sheet support. By repeating the process up to 3 times using photosensitive elements having different colors present in the photoadherent layer and exposing through the corresponding color separation transparency, the different colored images are adhered one on top of the other to form a 3- or 4-color surprint proof.

The advantageous properties of the processes of this invention can be observed by reference to the following examples.

| EXAMPLES GLOSSARY | |
|---|---|
| Black pigment | Raven ® 450, C.I. No. Pigment Black 7 |
| o-Cl-HABI | 1,1'-Biimidazole, 2,2'-bis [o-chlorophenyl]-4,4'5,5'-tetraphenyl-; CAS 1707-68-2 |
| Cyan pigment | Monastral ® Blue G (BT 383D); C.I. No. Pigment Blue 15; copper phthalocyanine |
| DBI | 1H-Inden-1-one, 2,3-dihydro-2-[4-(diethylamino)-2-methylphenyl]methylene-; CAS 71156-01-9 |
| Dimethoxy-JDI | 1H-Inden-1-one, 2,3-dihydro-5,6-dimethoxy-2-[(2,3,6,7-tetrahydro-1H,5H-benzo[i,j]quinolizin-9-yl)methylene]-; CAS 80867-05-6 |
| Elvacite ® 2051 | Poly(methyl methacrylate); MW = 350,000 |
| Epocryl ® 12 | Methacrylate ester of the epichlorohydrin adduct of bis-phenol A |
| FC-430 | Fluorad ® FC 430, liquid nonionic surfactant; 3M Company |
| Magenta pigment | Monastral ® Violet R; C.I. No. Pigment Violet 19 |
| Melinex ® 944 | Filled polyester sheet with a subbed coating manufactured by ICI Americas |
| 2-MBO | 2-Mercaptobenzoxazole; 2-Benzoxazolethiol; CAS 2382-96-9 |
| Methacrylate Dispersant | Elveron ® 6037; Poly(methylmethacrylate/2-ethylhexyl acrylate-Desmodur ® N adduct; Mn = 9,000 |
| 6-NVA | 6-Nitroveratraldehyde; benzaldehyde, 4,5-dimethoxy-2-nitro-; CAS 20357-25-9 |
| Polyox ® WSRN3000 | Polyethylene oxide, MW400,000 |
| PDNB | Benzene, 1-[1-[4-(1,1-dimethylethyl)-phenoxy]ethyl]-4,5-dimethoxy-2-nitro- |
| Scarlet Pigment | Indofast ® Brilliant Scarlet R6300; C.I. No. Pigment Red 123 |
| Stereon ® 709 | Styrene/butadiene random copolymer manufactured by Firestone |
| Yellow Pigment | Cromophtal ® Yellow 3G; C.I. No. Pigment Yellow 93 |

The peel-apart photosensitive elements having colored photoadherent layers are prepared as follows:

I. Colored Photoadherent Layers

Photopolymerizable Coating Composition

Coating compositions were prepared by adding the ingredients in the order shown in the table to 400 gm of methylene chloride and stirring between additions until successive ingredients were in solution or evenly dispersed throughout the mixture. To prevent exposure to visible radiation, all solutions were prepared in brown bottles. All quantities in the table are in grams.

| | 1 | 2 | 3 | 4 |
|---|---|---|---|---|
| Epocryl ® 12 | 18.72 | 18.72 | 18.82 | 18.72 |
| Elvacite ® 2051 | 18.36 | 17.30 | 20.81 | 15.72 |
| Yellow pigment | 4.32 | | | |
| Magenta pigment | | 3.34 | | |
| Scarlet pigment | | 0.95 | | |
| Cyan pigment | | | 2.09 | |
| Black pigment | | | | 5.37 |
| Methacrylate dispersant | 1.08 | 2.17 | 0.70 | 2.68 |
| o-Chloro HABI | 2.40 | 2.40 | 2.40 | 2.40 |
| 2-MBO | 0.83 | 0.83 | 0.83 | 0.83 |
| FC-430 | 0.10 | 0.10 | 0.10 | 0.10 |
| Polyox ® WSRN3000 | 0.34 | 0.34 | 0.34 | 0.34 |
| PDNB | 1.44 | 1.44 | 1.44 | 1.44 |
| Dimethoxy-JDI | 0.48 | 0.48 | 0.48 | 0.48 |
| | 5 | 6 | 7 | 8 |
| Epocryl ® 12 | 19.08 | 19.08 | 19.08 | 19.08 |
| Elvacite ® 2051 | 20.14 | 13.17 | 20.17 | 15.18 |
| Yellow pigment | 2.97 | | | |
| Magenta pigment | | 5.52 | | |
| Scarlet pigment | | 1.59 | | |
| Cyan pigment | | | 2.76 | |
| Black pigment | | | | 5.78 |
| Methacrylate dispersant | 0.74 | 3.59 | 0.92 | 2.89 |
| o-Chloro HABI | 2.40 | 2.40 | 2.40 | 2.40 |
| 2-MBO | 0.48 | 0.48 | 0.48 | 0.48 |
| FC-430 | 0.10 | 0.10 | 0.10 | 0.10 |
| Polyox ® WSRN3000 | 0.34 | 0.34 | 0.34 | 0.34 |
| 6-NNA | 1.44 | 1.44 | 1.44 | 1.44 |
| Dimethoxy-JDI | 0.36 | 0.36 | 0.36 | 0.36 |

Dried cast films (40 mg/dm$^2$ dry coating weight) were prepared from solutions 1-8. These films are identified as 1Y, 2M, 3C, 4K, 5Y, 6M, 7C, and 8K, respectively. The films were cast from a 12% methylene chloride solution with a 2 mil doctor knife. The films were cast onto 50 micron thick polyethylene terephthalate film which had been surface treated by electrostatic discharge (ED) at 0.05 coulomb/ft$^2$ (0.544 coulomb/m$^2$). Coating was carried out under filtered light so that no light of wavelength less than 500 nm reached the samples.

II. Contiguous Layer

Tacky Elastomer Coating Composition

A coating solution was prepared by mixing together the following ingredients:

| | 9 | 10 |
|---|---|---|
| Methylene chloride | 336 | 370 |
| Styrene-isoprene-styrene block copolymer | 63.70 | |
| Styrene-butadiene copolymer | | 30 |
| Tetra-bis methylene-3-(3,5)-di-tert-butyl-4-hydroxyphenyl)-propionate methane | | 0.30 |

Using an appropriate doctor blade the solutions were coated onto a 25 micron thick silicon release polyethylene terephthalate support sheet to give a coating weight of about 120 mg/dm$^2$ when dried. These contiguous, or adhesive, layers are designated 9 and 10, respectively. The adhesive layers were cast from a 16% methylene chloride solution (9) and a 7.5% solution (10) with a 8 mil and 14 mil doctor knife respectively to yield a dry thickness of about 120 mg/dm² on the silicone release polyester support.

Portions of each of the cast films (1Y to 8K) were laminated at room temperature to portions of each of the two cast adhesive layers (9 and 10) so that the following film sandwich combinations were prepared between 50 micron thick ED treated polyester, adhered to the cast photosensitive film, and silicone release polyester, adhered to the contiguous, or adhesive, layer:

| | |
|---|---|
| 1Y-9 | 1Y-10 |
| 2M-9 | 2M-10 |
| 3C-9 | 3C-10 |
| 4K-9 | 4K-10 |
| 5Y-9 | 5Y-10 |
| 6M-9 | 6M-10 |
| 7C-9 | 7C-10 |
| 8K-9 | 8K-10 |

NEGATIVE PROOF

EXAMPLE 1

Step 1: Sample 4K-9 was laminated with a Cromalin ® laminator, manufactured by E. I. du Pont de Nemours and Company, Wilmington, DE, at 230° F. (110° C.) to a receptor sheet (Melinex ® 994). During the lamination process the silicone release polyester support was removed so that the adhesive layer 9 was in direct contact with the receptor. All subsequent film laminations were carried out in this fashion.

Step 2: The laminated structure produced in Step 1 was placed in a vacuum frame with the black negative color separation of the desired test picture on top. A filter which passes only light of wavelength less than 385 nm (Dylux ® flexible filter manufactured by E. I. du Pont de Nemours and Company, Wilmington, DE 19898) was placed on top of the separation and a vacuum drawn before exposure. The sample was exposed for 210 seconds with a 5 kw high pressure mercury vapor lamp (Violux ® 5002S, Exposure Systems Company, Bridgeport, Conn., equipped with a photopolymer bulb) about 54 inches (about 21.3 cm) above the sample and integrator.

Step 3: After imagewise exposure (Step 2), the Dylux ® flexible filter was removed and the sample was given a blanket (i.e., nonimagewise) exposure through a Dylux ® clearing filter which allowed only light greater than 385 nm to pass. The blanket exposure ranged from 45–180 sec. Dylux ® filters are available from E. I. du Pont de Nemours, Wilmington, DE.

Step 4: After the blanket exposure, the structure was placed on a vacuum easel and the cover sheet peeled (about 6000 in/min, or 15240 cm/min) to produce a high quality black image representative of the black separation used.

Step 5: By the procedure of Step 1, sample 1Y-9 was laminated to the black image prepared in Steps 1–4. Steps 2–4 were repeated except that the yellow separation was used in register with the previously prepared black image.

Step 6: By the procedure of Step 1, sample 1M-9 was laminated to the two-color image prepared in Steps 1–5. Steps 2–4 were repeated except that the magenta separation was used in register with the previously prepared two-color image.

Step 7: By the procedure of Step 1, sample 1C-9 was laminated to the three-color image prepared in Steps 1–6. Steps 2–4 were repeated except that the cyan separation was used in register with the previously prepared three-color image.

Step 8: For protection, a sheet of polyester which had been coated with adhesive was laminated to the four-color proof prepared in Steps 1–7. A negative or reverse image precolored surprint proof (in this case, a positive with respect to the negative separation transparency) was thus produced.

EXAMPLES 2–4

The above eight step sequence can be used for samples 4K-10, 1Y-10, 2M-10 and 3C-10 to produce the same precolored negative or reverse surprint proof. In addition the same sequence can be used for film sets [8K-9,5Y-9,6M-9,7C-9] and [8K-10,5Y-10,6M-10,7C-10] except that the imagewise exposure in Step 2 is 510 seconds. The blanket exposure range is the same.

POSITIVE PROOF

EXAMPLE 5

Step 1: Sample 4K-9 was laminated at 230° F. (110° C.) to a receptor sheet (Melinex ® 994). During the lamination process the silicone release polyester was removed so that the adhesive layer 9 was in direct contact with the receptor. All subsequent film laminations were carried out in this fashion.

Step 2: The laminated structure produced in Step 1 was placed in a vacuum frame with the black positive color separation of the desired test picture on top. A filter which passes only light of wavelength greater than 385 nm (Dylux ® flexible filter) was placed on top of the separation and a vacuum drawn before exposure. The sample was exposed for about 180 seconds with a 5 kw high pressure mercury vapor lamp (Violux ® 5002S, Exposure Systems Company, Bridgeport, Conn., equipped with a photopolymer bulb) about 54 inches (about 21.3 cm) above the sample and integrator.

Step 3: After exposure, the filter was removed, the laminate structure placed on a vacuum easel and the cover sheet peeled (about 6000 in/min, or 15240 cm/min) to produce a high quality black positive image representative of the black separation used.

Step 4: By the procedure of Step 1, sample 1Y-9 was laminated to the black image prepared in Steps 1–3. Steps 2–3 were repeated except the yellow separation was used in register with the previously prepared black image.

Step 5: By the procedure of Step 1, sample 1M-9 was laminated to the two-color image prepared in Steps 1–4. Steps 2–3 were repeated except the magenta separation was used in register with the previously prepared two-color image.

Step 6: By the procedure of Step 1, sample 1C-9 was laminated to the three-color image prepared in Steps 1–5. Steps 2–3 were repeated except the cyan separation was used in register with the previously prepared three-color image.

Step 7: For protection a sheet of polyester which had been coated with as adhesive was laminated to the four-color proof prepared in Steps 1–6. A positive precolored surprint proof was thus produced.

EXAMPLES 6–8

The above seven step sequence can be used for samples 4K-10, 1Y-10 2M-10 and 3C-10 to produce the same precolored positive surprint proof. In similar fashion, as above, the film sets [8K-10, 5Y-10, 6M-10, 7C-10] and [8K-9, 5Y-9, 6M-9, 7C-9] can be also be used. The imaging exposure is approximately the same since the imaging reaction with dimethoxy-JDI is the same for all film sets using the positive mode.

EXAMPLES 9-10

Coating solutions were prepared from the following ingredients as described above. Methylene chloride was used as the coating solvent. The coating solution contained about 12% by weight solids. All quantities in the table are in grams.

|  | 11 | 12 | 13 | 14 |
|---|---|---|---|---|
| Epocryl ® 12[a] | 348.7 | 392.3 | 348.7 | 348.7 |
| Elvacite ® 2051 | 281.3 | 278.0 | 281.7 | 173.3 |
| Yellow pigment | 40.8 | | | |
| Magenta pigment | | 113.8 | | |
| Scarlet pigment | | 32.6 | | |
| Cyan pigment | | | 38.0 | |
| Black pigment | | | | 79.5 |
| Methacrylate dispersant | 10.2 | 74.1 | 12.6 | 79.5 |
| o-Chloro HABI | 26.4 | 39.6 | 26.4 | 26.4 |
| 2-MBO | 11.4 | 17.0 | 11.4 | 11.4 |
| FC-430[b] | 6.6 | 9.9 | 6.6 | 6.6 |
| Polyox ® WSRN3000 | 4.62 | 6.93 | 4.62 | 4.62 |
| PDNB | 19.80 | 29.70 | 19.80 | 19.80 |
| DBI | 3.30 | 4.95 | 3.30 | 3.30 |

[a]75% in methylene chloride
[b]10% in methylene chloride

Dried cast films (about 30 mg/dm$^2$ dry coating weight) were prepared from solutions 11-14. These films were identified as 11Y, 12M, 13C, and 14K, respectively. The films were coated with a 12 inch pilot coater. The films were coated onto 50 micron thick polyethylene terephthalate film which had been surface treated by electrostatic discharge (ED) at 0.05 coulomb/ft$^2$ (0.544 coulomb/m$^2$). Coating was carried out under filtered light so that no light of wavelength less than 500 nm reached the samples.

Steron ® 709 butadiene/styrene rubber was coated from an about 7.5% methylene chloride solution onto a 25 micron thick silicon release polyethylene terephthalate support sheet to give a coating weight of about 120 mg/dm$^2$ when dried. This adhesive layer is designated 15.

Portions of each of the coated films (11Y to 14K) were laminated at room temperature to portions of the coated adhesive layer (15) so that the following film sandwich combinations were prepared between 50 micron thick ED treated polyester, adhered to the coated film, and silicone release polyester, adhered to the adhesive layer:

| |
|---|
| 11Y-15 |
| 12M-15 |
| 13C-15 |
| 14K-15 |

Following the procedures given above both positive and negative four-color surprint proofs were prepared from these coatings.

What is claimed is:

1. A process for producing a negative or reverse image on a multilayer peel-apart photosensitive element, comprising, in the stated order, the steps of:
   (1) providing a multilayer peel-apart photosensitive element, comprising, in order from top to bottom,
      (a) a strippable cover sheet comprised of a polymeric film which is transparent to actinic radiation,
      (b) a photoadherent layer comprising a photohardenable material with ethylenically unsaturated groups, an o-nitroaromatic photoinhibitor compound, a free-radical generating photoinitiator or photoinitiator system activatable by actinic radiation of wavelength(s) greater than 380 nm, and a colorant, and
      (c) an essentially nonphotosensitive organic contiguous layer;
      wherein, after exposure to actinic radiation substantially limited to wavelengths greater than about 380 nm, the peel force required to remove the cover sheet (a) with the exposed photoadherent layer (b) thereon from the contiguous layer (c) is at least four times the peel force required to remove the cover sheet (a) from the unexposed photoadherent layer (b),
   (2) exposing the multilayer peel-apart element through an image-bearing transparency to actinic radiation substantially limited to wavelengths of about 200 to about 380 nm, whereby a polymerization inhibitor is formed in the areas of the photoadherent layer struck by the radiation;
   (3) exposing the element overall to actinic radiation substantially limited to wavelengths greater than 380 nm, whereby the areas of the photoadherent layer unexposed in step (2) are polymerized;
   (4) peeling the cover sheet (a) from the photoadherent layer (b), whereby the areas of the photoadherent layer exposed in step (2) remain on the contiguous layer (c) as a negative or reverse image of the transparency used.

2. A process according to claim 1, wherein the multilayer, peel-apart photosensitive element further comprises a releasable support (d) adhered to the contiguous layer (c), and wherein before step (2) the releasable support is removed, and the element is adhered to a receptor support.

3. A process according to claim 1, wherein steps (1) to (4) are repeated at least once, each time using a peel-apart photosensitive element comprising a different colorant which is adhered to the preceding element by its contiguous layer (c), and exposed in register through a corresponding color separation transparency, whereby a multicolor reverse image is formed.

4. A process according to claim 3, wherein four peel-apart photosensitive elements colored yellow, magenta, cyan, and black, respectively, are sequentially adhered in any order to the preceding element and exposed in register through a correspondingly colored separation transparency, to produce a four-color reverse image.

5. A process according to claim 3, wherein each color separation transparency is a negative, and the reverse image produced is a positive.

6. A process of claim 1, wherein the photoadherent layer consists essentially of
   (i) 1 to 20% by weight of colorant;
   (ii) 30 to 55% by weight of at least one macromolecular organic polymeric binder;
   (iii) 25 to 50% by weight of at least one addition polymerizable ethylenically unsaturated monomer;
   (iv) 0.1–10% by weight of a free-radical generating addition polymerization photoinitiator or photoinitiating system, activatable by actinic radiation wavelength(s) greater than 380 nm; and (v) 0.004 to 0.07 part per weight, based on the amount of said ethylenically unsaturated monomer, of at least one o-nitroaromatic photoinhibitor compound.

7. A process of claim 6 wherein the photoinhibitor compound is an o-nitroaromatic compound of the formula:

wherein $R^1$ and $R^2$, alike or different, are alkoxy of 1 to 6 carbon atoms;

$R^3$ is hydrogen or alkyl of 1 to 6 carbon atoms;

$R^4$ is alkoxy of 1 to 6 carbon atoms or phenoxy substituted with up to two alkyl and/or alkoxy groups of 1 to 6 carbon atoms; or

$R^3$ and $R^4$ taken together are =O.

8. The process of claim 7 wherein the photoinhibitor compound is selected from the group consisting of 4,5-dimethoxy-2-nitrobenzaldehyde and 1-[1-[4-(1,1-dimethylethyl)-phenoxy] ethyl]-4,5-dimethoxy-2-nitrobenzene.

9. The process of claim 7 wherein the photoadherent layer contains a radiation-sensitive, free radical generating system consisting essentially of a 2,4,5-triarylimidazole dimer, a hydrogen donor and a visible light sensitizer.

10. The process of claim 9 wherein the 2,4,5-triarylimidazole dimer is selected from the group consisting of 2-(o-chlorophenyl)-4,5-bis(m-methoxyphenyl)-imidazole dimer; 1,1'-biimidazole, 2,2'-bis (o-chlorophenyl)-4,4',5,5'-tetraphenyl-; and 1H-imidazole, 2,5-bis(o-chlorophenyl)-4-[3,4-dimethoxyphenyl]-, dimer.

11. The process of claim 9 wherein the visible light sensitizer is a ketone of the formula wherein $R^1$, $R^2$, and $R^3$ are, independently, H or alkoxy of 1 to 6 carbon atoms;

Z is $CH_2$ or $C(CH_3)_2$;

$R^4$ is H, $CH_3$, or methoxy;

$R^5$ and $R^6$ are H;

$R^7$, $R^8$ are, independently, $CH_3$ or $CH_2CH_2$; or $R^5+R^8$ and $R^6+R^7$ are, independently, $-(CH_2)_2-$ or $-(CH_2)_3-$.

12. The process of claim 11 wherein the visible sensitizer is selected from the group consisting of 1H-inden-1-one, 2,3-dihydro-5,6-dimethoxy-2-[(2,3,6,7-tetrahydro-1H,5H-benzo[i,j]quinolizin-9-yl)methylene]-; and 1H-inden-1-one, 2,3-dihydro-2[(4-(diethylamino)-2-methylphenyl)methylene]-.

* * * * *